United States Patent Office
3,499,782
Patented Mar. 10, 1970

3,499,782
SUBSTRATE PROTECTIVE OXIDIZED COATING PROCESS

William L. Shockley, Richardson, Tex., assignor to Collins Radio Company, Cedar Rapids, Iowa No Drawing. Filed July 7, 1965, Ser. No. 470,223
Int. Cl. B44d *1/44;* C03c *17/00, 13/00*
U.S. Cl. 117—62 1 Claim

ABSTRACT OF THE DISCLOSURE

A process for developing a passivated thin film layer on a substrate so impervious to acids and alkaline solutions used in forming electrical circuits as to provide substantially complete protection to the substrate and with the passivated layer maintaining its passivated integrity throughout subsequent thin film circuit forming processes conducted thereover. This is accomplished by depositing a valve metal (such as tantalum) film approximately 800 angstrom units thick upon a substrate surface and then submitting the structure to prolonged baking in an oxygen rich atmosphere at a temperature of approximately 550° C. for approximately ten hours.

This invention relates in general to the surfacing of substrate and, in particular, to a process for providing passivated substrate surfaces so that the substrate is substantially impervious to various highly corrosive acids and alkaline solutions used in forming electrical circuits on the substrate.

Problems have been encountered in the production of electrical circuits formed on substrate in that some substrate materials have been subject to undesired etching, pitting, and/or frosting by various chemicals. These chemicals include hydrofluoric acid, sulphuric acid, aquaregia, nitric acid, sodium hydroxide, chomic acid, etc., and various alkaline solutions used in various electric circuit deposition, etching, and other removing and/or forming processes.

It is, therefore, a principal object of this invention to provide a circuit mounting substrate with the circuit mounting surfaces so passivated that the substrate structure is substantially impervious to various highly corrosive acids and alkaline solutions used in forming electrical circuits on such substrate.

A further object is, by use of the process, the substantial elimination of etching, pitting, and/or frosting of substrate surfaces.

These objects and other beneficial results are accomplished through the use of applicant's substrate surface passivating process prior to various subsequent manufacturing processes used in forming electric circuits on the substrate. These processes may include deposition of a thin film of conductive material and then subsequent steps such as chemical etching, oxidizing, and other material modifying processes used in producing thin film electronic circuits. The improved process involves deposition of a thin film of valve metal of the family niobium, zirconium, hafnium, tantalum, titanium, and aluminum on a clean glass substrate (or other substrate material suitable as the support mounting means for thin film deposition and circuit buildup thereon and amenable to the subject process). The valve metal film coated substrate is then placed in an elevated temperature oxidizing media environment for sufficient time to attain substantially complete conversion of the valve metal film to the oxide form. This results in passivated substrate surfaces quite useful as mounting surfaces for the forming of electric circuits thereon with process steps utilizing chemicals such as hydrofluoric acid, sulphuric acid, aquaregia, nitric acid, sodium hydroxide, chromic acid, etc., and various alkaline solutions as may be used in producing thin film circuits. These various highly corrosive acids and alkaline solutions may be used in forming electric circuits on the passivated substrate surfaces without any significant etching, pitting, or frosting of such passivated substrate surfaces.

Applicant's process for providing passivated substrate surfaces, in greater detail according to applicant's process, is illustrated by a specific example utilizing the valve metal tantalum. This includes supplying a layer of tantalum metal such as by vapor deposition of a tantalum film of suitable thickness (approximately 800 angstrom units thick in the specific process example) as by well-known sputter or vapor deposition techniques upon substrate surfaces, to be provided with a passivated coating of a suitable substrate (a clean glass substrate in the specific process example). Thereafter, the substrate structure with the tantalum metal layer coated surface area to be passivated is placed in an elevated temperature atmosphere consisting of air or pure oxygen or other oxygen rich gas for a period of time. In the specific process example, the substrate structure is placed in a pure oxygen atmosphere, at atmospheric pressure, with an environmental temperature of approximately 550° C. for approximately ten hours. This is sufficient process time in the high temperature oxygen environment to insure substantially complete conversion of the tantalum metal (Ta) to an oxide form providing a very hard, inert, transparent oxide film. It should be noted, that this oxidization process of the tantalum results in expansion of the initially approximately 800 angstrom unit thick tantalum layer to an oxide layer thickness approximately in the range of from 1,100 to 1,200 angstrom units thick.

Obviously, applicant's process may be particularly adapted to and employed in the process provision of substrate surface passivated coatings formed of various oxide layers of other valve metals of the family niobium, zirconium, hafnium, tantalum, titanium and aluminum. These process adaptations and modifications are accomplished with oxidizing atmospheres, temperatures, and times particularly tailored to the requirements imposed by the particular valve metal employed, and, further with the additional influencing factors imposed by particular valve metal film thicknesses required to provide finished substantially completely oxidized passivated substrate surface layers of required thickness for attaining desired substrate surface protective results.

Whereas, this invention is here described with respect to various closely related process variation embodiments thereof, it should be realized that various process changes may be made without departing from the essential contribution to the art made by the teachings hereof.

I claim:

1. In a process for providing passivated substrate structure material surface layers suitable as substrate surfaces for the forming of electrical circuits thereon and substantially impervious to various highly corrosive acid and alkaline solutions that may be used in forming electrical circuits on substrate with the substrate material capable of maintaining required structural integrity after having endured temperatures in the range of approximately 550° C. through an extended period of time approximating ten hours: process means successively including, deposition of the valve metal tantalum to a layer thickness approximating 800 angstrom units thickness, on a substrate material throughout a substrate surface area to be passivated, further, with the valve metal being deposited to sufficient thickness to provide, when converted to the oxidized passivated state, the degree of passivated substrate surface protection required; and then insertion of the substrate structure with the valve metal layer coated area in an oxygen rich atmosphere at an elevated temperature for sufficient time, consistent with the characteristics of the atmosphere and the elevated temperature employed, to substantially completely convert the valve metal layer to the oxide passivated form and wherein the substrate structure with the tantalum metal layer coated area is held in the oxygen rich atmosphere at a temperature of approximately 550° C. for approximately ten hours to provide substantially complete conversion of the tantalum metal layer Ta to a tantalum oxide hard, inert, transparent oxide passivated layer of a thickness approximately in the range of 1,100 to 1,200 angstrom units thickness.

References Cited

UNITED STATES PATENTS

| | | | |
|---|---|---|---|
| 3,076,727 | 2/1963 | Harwig | 117—107 X |
| 3,208,873 | 9/1965 | Ames et al. | 117—106 |
| 3,290,233 | 12/1966 | Hay et al. | 117—118 |

ALFRED L. LEAVITT, Primary Examiner

T. E. BOKAN, Assistant Examiner

U.S. Cl. X.R.

117—107, 124; 148—6.3